(12) United States Patent
Prentice et al.

(10) Patent No.: US 11,554,436 B2
(45) Date of Patent: *Jan. 17, 2023

(54) IR NON-CONTACT TEMPERATURE SENSING IN A DISPENSER

(71) Applicant: Illinois Tool Works Inc., Glenview, IL (US)

(72) Inventors: Thomas C. Prentice, Westford, MA (US); Scott A. Reid, Bradford, MA (US); Patsy A. Mattero, Smithfield, RI (US); Fernando J. Aguiar, Westport, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/170,989

(22) Filed: Feb. 9, 2021

(65) Prior Publication Data

US 2021/0162528 A1 Jun. 3, 2021

Related U.S. Application Data

(63) Continuation of application No. 16/357,854, filed on Mar. 19, 2019, now Pat. No. 10,933,483, and a continuation-in-part of application No. 15/831,800, filed on Dec. 5, 2017, now abandoned.

(60) Provisional application No. 62/792,087, filed on Jan. 14, 2019.

(51) Int. Cl.
*B23K 3/06* (2006.01)
*B23K 3/08* (2006.01)

(52) U.S. Cl.
CPC .............. *B23K 3/0638* (2013.01); *B23K 3/08* (2013.01)

(58) Field of Classification Search
CPC .................................................. B23K 3/0638
See application file for complete search history.

(56) References Cited

U.S. PATENT DOCUMENTS

| 4,515,297 | A | 5/1985 | Schoenthaler et al. |
| 4,622,239 | A | 11/1986 | Schoenthaler et al. |
| 4,773,326 | A | 9/1988 | Hudec |
| 5,906,682 | A | 5/1999 | Bouras et al. |

(Continued)

FOREIGN PATENT DOCUMENTS

| CN | 1661493 A | 8/2005 |
| CN | 102481783 A | 5/2012 |

(Continued)

OTHER PUBLICATIONS

Notification of Transmittal of the International Search Report and the Written Opinion of the International Searching Authority from corresponding PCT/US2019/066536 dated May 18, 2020.

*Primary Examiner* — Matthew G Marini
*Assistant Examiner* — Marissa Ferguson-Samreth
(74) *Attorney, Agent, or Firm* — Lando & Anastasi, LLP

(57) ABSTRACT

A dispensing system includes an optional pre-heat station configured to receive an electronic substrate, a dispense station configured to dispense material on the electronic substrate received from the optional pre-heat station, an optional post-heat station configured to receive the electronic substrate from the dispense station, and a non-contact sensor positioned above the electronic substrate on at least one of the optional pre-heat station, the dispense station, and the optional post-heat station.

10 Claims, 12 Drawing Sheets

(56) References Cited

U.S. PATENT DOCUMENTS

| | | |
|---|---|---|
| 6,395,334 B1 | 5/2002 | Prentice et al. |
| 6,453,810 B1 | 9/2002 | Rossmeisl et al. |
| 6,571,701 B1 | 6/2003 | Pham-Van-Diep et al. |
| 7,215,899 B2 | 5/2007 | Kimizuka et al. |
| 8,520,929 B1 | 8/2013 | Murray et al. |
| 8,767,025 B2 | 7/2014 | Usui |
| 9,662,675 B2 | 5/2017 | Doyle |
| 2003/0128267 A1 | 7/2003 | Teung et al. |
| 2003/0137080 A1 | 7/2003 | Bouras et al. |
| 2005/0191075 A1 | 9/2005 | Kimizuka et al. |
| 2006/0011075 A1 | 1/2006 | Claiborne |
| 2006/0191075 A1 | 8/2006 | Stoessel et al. |
| 2008/0011951 A1 | 1/2008 | Delcher et al. |
| 2011/0023966 A1 | 2/2011 | Watanabe et al. |
| 2011/0233239 A1 | 9/2011 | Rasa et al. |
| 2013/0188002 A1 | 7/2013 | Usui |

FOREIGN PATENT DOCUMENTS

| | | | | |
|---|---|---|---|---|
| CN | 103545237 A | 1/2014 | | |
| CN | 104070258 A | 10/2014 | | |
| CN | 104203579 A | 12/2014 | | |
| CN | 104936783 A | 9/2015 | | |
| CN | 105793973 A | 7/2016 | | |
| CN | 106211606 A | 12/2016 | | |
| CN | 106739444 A | 5/2017 | | |
| EP | 1656256 A1 | 5/2006 | | |
| EP | 2279821 A2 | 2/2011 | | |
| EP | 3267147 A1 | 1/2018 | | |
| EP | 326714147 | * | 1/2018 | ............ B05C 5/022 |
| JP | H02132879 A | 5/1990 | | |
| JP | H09300682 A | 11/1997 | | |
| JP | 2002361915 A | 12/2002 | | |
| JP | 2013035235 A | 2/2013 | | |
| JP | 5236334 B2 | 7/2013 | | |
| TW | 201924948 A | 7/2019 | | |

* cited by examiner

Configure 8300 Dispenser Database

First Station

- Select the first station that boards will arrive at in this machine from the list below:
  ○ Dispense Station    ○ Input Buffer    ● Pre-Heat Station
- Select the Input-Buffer options from the list below that match your machine's configuration
  ☑ Chuck or Edge Clamps
  If the is checked boards will "Maintain clamping until clear to move downstream".
  If the is unchecked boards will never be lifted off of the conveyor at this station.
- Select the Pre-Heat options from the list below that match your machine's configuration Chuck Type
  ○ Contact Heat    ● Non-Contact Heat    [ ☑ IR Sense ]
  ☐ Vacuum (can't have with Non-Contact Heat)    ☑ Maintain clamping until clear to move downstream

Last Station

- Select the last station that a board is at before it will leave this machine from the list below:
  ○ Dispense Station    ○ Output Buffer    ● Post-Heat Station
- Select the Output-Buffer options from the list below that match your machine's configuration
  ☐ Chuck or Edge Clamps
  If the is checked boards will "Maintain clamping until clear to move downstream".
  If the is unchecked boards will never be lifted off of the conveyor at this station.
- Select the Post-Heat options from the list below that match your machine's configuration Chuck Type
  ○ Contact Heat    ● Non-Contact Heat    [ ☑ IR Sense ]
  ☐ Vacuum (can't have with Non-Contact Heat)    ☑ Maintain clamping until clear to move downstream

Dispense Station Configuration

Chuck
- ○ Contact Heat
- ● Non-Contact Heat
- ○ Non-Heated
- ☐ Vacuum (can't have with Non-Contact Heat)

Z-Head
- ○ Single Z-Head          ● Dual Z-Head
- Left Z-Head              Right Z-Head
- ☐ Heated Valve           ☑ Heated Valve
- ☐ Liquid Level Sense     ☐ Liquid Level Sense
- ☐ HiCap II               ☐ HiCap II
- ☐ Ext Cartridge Single   ☐ Ext Cartridge Single
- ☐ Ext Cartridge Dual     ☐ Ext Cartridge Dual
- ☐ Mini Stage ZSense Type: [Laser CD33 ▾]   ☐ Two Steps Laser Caligration (Tilt Pump)

- ☐ Needle Calibrator
- ☐ Needle Cleaner
- ☐ Needle Detector
- ☐ Single Needle Cleaner for both ZHeads
- ☐ Position of second needle cleaner is adjustable

- ☑ Maintain clamping until clear to move downstream
- ☑ Weight Scale Installed
- ☐ Predispense Plates Installed
- ☑ Software controlled syringe pressure
- ☑ IR Sense

| Controller | Enable Communications | Actual Temp | Setpoint | Alarm Range in degrees | Alarm Status |
|---|---|---|---|---|---|
| Pre Heat Station Lane 1 | ☑ | 0.0 | 120.0 | 10.0 | Power is off |
| Dispense Station Lane 1 | ☑ | 0.0 | 105.0 | 10.0 | Power is off |
| Post Heat Station Lane 1 | ☑ | 0.0 | 120.0 | 10.0 | Power is off |
| Dispense ZHead1 | ☑ | 0.0 | 60.0 | 5.0 | Power is off |
| Dispense ZHead2 | ☑ | 0.0 | 60.0 | 5.0 | Power is off |
| Pre Heat Station Lane 2 | ☑ | 0.0 | 120.0 | 10.0 | Power is off |
| Dispense Station Lane 2 | ☑ | 0.0 | 105.0 | 10.0 | Power is off |
| Post Heat Station Lane 2 | ☑ | 0.0 | 120.0 | 10.0 | Power is off |

Creation Info | Properties | Temperatures | Load/Unload Boat | Commands

☐ Heat Required
☑ Use Temperature settings from Process Program

NOTE:
The parameters from the temperature controller(s) will be sent to the hardware when:
⦿ User save the Process Program by pressing the "Save" button
OR
⦿ User press the "Start" button Pre Heat Duration: [10] secs Pre Heat IR Sensing
☐ Enable
Min Temperature: [90] celcius
Max Temperature: [99] celcius
Soak Time: [5] secs
Timeout: [500] secs
Polling Rate: [500] msecs Pre Heat Cycle Air
☑ Enable    Air On: [1] secs
            Air On: [1] secs Dispense IR Sensing
Min Temperature: [90] celcius
Max Temperature: [99] celcius
Timeout: [20] secs
Polling Rate: [500] msecs Dispense Cycle Air
Air On: [1] secs
Air On: [1] secs Post Heat Duration: [10] secs Post Heat IR Sensing
☐ Enable
Min Temperature: [90] celcius
Max Temperature: [99] celcius
Soak Time: [5] secs
Timeout: [20] secs
Polling Rate: [500] msecs Pre Heat Cycle Air
☑ Enable    Air On: [1] secs
            Air On: [1] secs

| Process Program | Process Program Variable Ranges | Security - 1 | Security - 2 | SPC Data | Buttons | Open Apps |
|---|---|---|---|---|---|---|
| Display Settings | Machine | Head/Syringe | Needle Clean/Purge | Weight Scale(s) | Conveyor | Vision | Temperature |

Temperature Controllers (all temperatures are in degrees Celcius)

| Controller | Enable Communications | Actual Temp | Setpoint | Alarm Range in degrees | Alarm Status |
|---|---|---|---|---|---|
| Pre Heat Station Lane 1 | ☐ | 0.0 | 120.0 | 10.0 | Using Process Program Parameters |
| Dispense Station Lane 1 | ☐ | 0.0 | 105.0 | 10.0 | Using Process Program Parameters |
| Post Heat Station Lane 1 | ☐ | 0.0 | 120.0 | 10.0 | Using Process Program Parameters |
| Dispense ZHead1 | ☑ | 0.0 | 60.0 | 5.0 | Using Process Program Parameters |
| Dispense ZHead2 | ☑ | 0.0 | 60.0 | 5.0 | Using Process Program Parameters |
| Pre Heat Station Lane 2 | ☐ | 0.0 | 120.0 | 10.0 | Using Process Program Parameters |
| Dispense Station Lane 2 | ☐ | 0.0 | 105.0 | 10.0 | Using Process Program Parameters |
| Post Heat Station Lane 2 | ☐ | 0.0 | 120.0 | 10.0 | Using Process Program Parameters |

☐ Power On Heat Controllers At Machine Startup

☑ Power Off All Heat When Idle
  Power Off Heat When Idle [10] Minutes
  ☐ Disable Power Off Heat Function While Running Process

FIG. 11

| Process Program | | Process Program Variable Ranges | | Security - 1 | Security - 2 | SPC Data | Buttons | Open Apps |
|---|---|---|---|---|---|---|---|---|
| Display Settings | Machine | Head/Syringe | | Needle Clean/Purge | Weight Scale(s) | Conveyor | Vision | Temperature |

Temperature Controllers (all temperatures are in degrees Celcius)

| Controller | Enable Communications | Actual Temp | Setpoint | Alarm Range in degrees | Alarm Status |
|---|---|---|---|---|---|
| Pre Heat Station Lane 1 | ☐ | 0.0 | 120.0 | 10.0 | Power is off |
| Dispense Station Lane 1 | ☐ | 0.0 | 105.0 | 10.0 | Power is off |
| Post Heat Station Lane 1 | ☐ | 0.0 | 120.0 | 10.0 | Power is off |
| Dispense ZHead1 | ☑ | 0.0 | 60.0 | 5.0 | Power is off |
| Dispense ZHead2 | ☑ | 0.0 | 60.0 | 5.0 | Power is off |
| Pre Heat Station Lane 2 | ☐ | 0.0 | 120.0 | 10.0 | Power is off |
| Dispense Station Lane 2 | ☐ | 0.0 | 105.0 | 10.0 | Power is off |
| Post Heat Station Lane 2 | ☐ | 0.0 | 120.0 | 10.0 | Power is off |

☑ Power On Heat Controllers At Machine Startup
☐ Power Off All Heat When Idle
Power Off Heat When Idle [1] Minutes
☐ Disable Power Off Heat Function While Running Process

IR NON-CONTACT TEMPERATURE SENSING IN A DISPENSER

RELATED APPLICATIONS

This patent application is a continuation patent application of U.S. patent application Ser. No. 16/357,854 filed on Mar. 19, 2019 titled "IR Non-Contact Temperature Sensing in a Dispenser," which application claims priority under 35 U.S.C. § 119(e) to U.S. Provisional Application Ser. No. 62/792,087 titled "IR Non-Contact Temperature Sensing in a Dispenser" filed on Jan. 14, 2019, which is herein incorporated by reference in its entirety, and claims priority to U.S. application Ser. No. 15/831,800, titled "Material Temperature Sensor for Stencil Printer" filed on Dec. 5, 2017 [abandoned], all of which are hereby incorporated by references in their entirety for all purposes.

BACKGROUND OF THE DISCLOSURE

1. Field of the Disclosure

The present disclosure relates to an apparatus and process for dispensing material, and more specifically to an apparatus and process for dispensing solder paste in a dispenser.

2. Discussion of Related Art

There are several types of dispensing systems used to dispense precise amounts of liquid or paste for a variety of applications. One such application is the assembly of integrated circuit chips and other electronic components onto circuit board substrates. In this application, automated dispensing systems are used for dispensing dots of liquid epoxy or solder paste, or some other related material, onto circuit boards. Automated dispensing systems are also used for dispensing lines of underfill materials and encapsulents, which may be used to mechanically secure components to the circuit board. Exemplary dispensing systems described above include those manufactured and distributed by ITW EAE of Glenview, Ill. under the brand name CAMALOT®.

In a typical dispensing system, a pump and/or dispenser assembly is mounted to a moving assembly or gantry for moving the pump and dispenser assembly along three mutually orthogonal axes (X-axis, Y-axis, Z-axis) using servomotors controlled by a computer system or controller. To dispense a dot of liquid on a circuit board or other substrate at a desired location, the pump and dispenser assembly is moved along the co-planar horizontal X-axis and Y-axis until it is located over the desired location. In one embodiment, the pump and/or dispenser assembly is then lowered along the perpendicularly oriented vertical Z-axis until a nozzle/needle of the pump and dispenser assembly is at an appropriate dispensing height over the electronic substrate. The pump and/or dispenser assembly dispenses a dot of liquid, is then raised along the Z-axis direction, moved along the X-axis and the Y-axis directions to a new location, and is lowered along the Z-axis direction to dispense the next liquid dot. In another embodiment, material is jetted from the pump and dispenser assembly without lowering and raising the nozzle/needle of the pump and dispenser assembly. For applications such as encapsulation or underfilling as described above, the pump and dispenser assembly is typically controlled to dispense lines of material as the pump and dispenser assembly are moved in the X-axis and the Y-axis directions along the desired path of the lines.

The use of an IR temperature sensor to monitor the temperature of a supply cartridge of solder paste in a stencil printer is known, motivated by the need to ensure that the paste was up to the proper temperature to proceed with a print deposition. Similarly, the application of material temperature sensing in a pump and dispenser assembly of a dispensing system is known, motivated by the need to ensure that material stored at a temperature lower than a proper application temperature had indeed warmed to the proper temperature for deposition.

SUMMARY OF THE DISCLOSURE

One aspect of the present disclosure is directed to a dispensing system comprising an optional pre-heat station configured to receive an electronic substrate, a dispense station configured to dispense material on the electronic substrate received from the optional pre-heat station, an optional post-heat station configured to receive the electronic substrate from the dispense station, and a non-contact sensor positioned above the electronic substrate on at least one of the optional pre-heat station, the dispense station, and the optional post-heat station.

Embodiments of the dispensing system further may include the non-contact sensor being positioned above the electronic substrate on the optional pre-heat station to ensure that the electronic substrate is at a proper temperature before moving the electronic substrate to the dispense station. The non-contact sensor may be mounted on an adjustable mechanism that moves towards and away from a target of the temperature measurement. The non-contact sensor may be positioned above the dispense station to ensure that the electronic substrate is at a proper temperature at the dispense station. The non-contact sensor may be mounted on an adjustable mechanism associated with the dispense station. The non-contact sensor may be positioned above the electronic substrate on the optional post-heat station to ensure that the electronic substrate is at a proper temperature at the optional post-heat station. The non-contact sensor may be mounted on an adjustable mechanism that moves towards and away from a target of the temperature measurement. The non-contact sensor may be an infrared temperature sensor.

Another aspect of the present disclosure is directed a dispensing system configured to dispense a viscous assembly material on an electronic substrate. In one embodiment, the dispensing system comprises a conveyor configured to move electronic substrates through the dispensing system, a dispense station including a dispensing unit configured to dispense viscous assembly material on an electronic substrate, and a sensor coupled to the dispensing unit, the sensor being configured to measure a temperature of the electronic substrate.

Embodiments of the dispensing system further may include the sensor being a non-contact sensor. The non-contact sensor may be an infrared sensor. The non-contact sensor may be secured to the dispensing unit by an adjustable bracket. The adjustable bracket may be configured to orient the non-contact sensor at an angle with respect to an orientation of the electronic substrate.

Yet another aspect of the present disclosure is directed to a method of printing an assembly material on an electronic substrate. In one embodiment, the method comprises: delivering an electronic substrate to a dispensing system; positioning the electronic substrate in a print position; dispensing viscous assembly material on the electronic substrate; and measuring a temperature of the electronic substrate.

Embodiments of the method further may include providing temperature feedback of the electronic substrate as part of a temperature regulation system. Providing temperature feedback may include, when an electronic substrate has reached a desired target temperature, the temperature control system turns off the heat to the electronic substrate, and when the temperature drops below a low temperature limit, the temperature control system turns the heat on. Measuring a temperature of the electronic substrate may be achieved by a sensor. The sensor may be a non-contact sensor. The non-contact sensor may be an infrared sensor. The method further may include positioning the non-contact sensor with respect to the electronic substrate by an adjustable bracket.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

FIG. 3 is a graphic user interface ("GUI") of an infrared ("IR") sense configuration graphic associated with the pre-heat station and the post-heat station;

FIG. 4 is a GUI of an IR sense configuration graphic associated with the dispense station;

FIGS. 5 and 6 are GUIs of a process programming graphic;

FIG. 11 is a GUI of a heat options graphic; and

FIG. 12 is a GUI of a power on heat controllers graphic.

DETAILED DESCRIPTION OF THE DISCLOSURE

Figure 1:
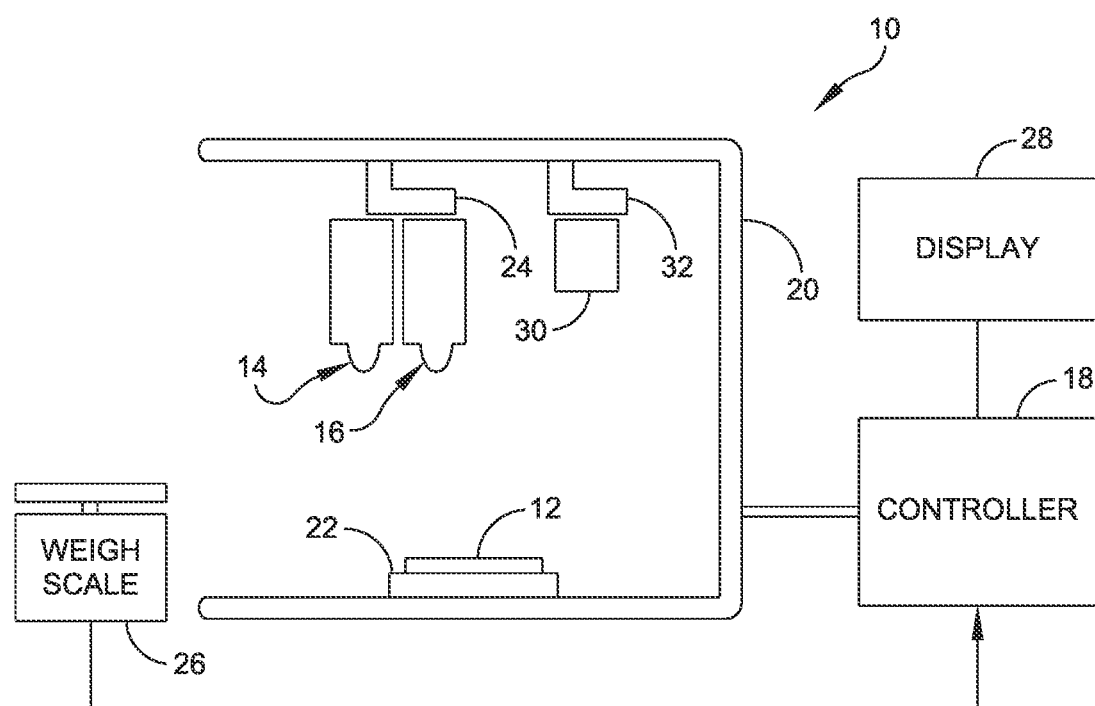
FIG. 1 is a schematic view of a dispensing system.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

The present disclosure is directed to sensing not only the temperature of the material to be deposited, but also the temperature of the electronic substrate upon which the material is to be deposited. For example, it is well-known in the SMT assembly industry that the electronic substrate in a dispenser is often preheated before deposition of underfill materials. Typical applications utilize what is known as a pre-heat "chuck" (an area or zone for heating an electronic substrate to a pre-determined temperature), before the electronic substrate is transported into a dispense zone to receive the material to be dispensed. A problem with the preheat zone is that there is typically only one feedback sensor to measure the temperature of the entire pre-heat chuck, which is typically 330 mm×250 mm. This feedback from a single sensor generally senses the temperature at one location, and the result is assumed to represent the temperature for the entire pre-heat zone, and does not necessarily reflect the actual temperature of a specific location of interest, for example the temperature of a critical component. Furthermore, without feedback of the actual temperature of specific location of the electronic substrate, the time allocated to pre-heat the electronic substrate is often selected to ensure that at least a sufficient time has passed for the temperature of the electronic substrate to stabilize. This may mean that valuable time is wasted waiting for an excessively long "sufficient" time period.

Embodiments of the present disclosure include a non-contact sensor positioned above the electronic substrate on the pre-heat chuck to confirm that the electronic substrate is indeed at the proper temperature before proceeding with the dispensing operation, without the need to wait longer than necessary to ensure that the electronic substrate is up to temperature. By mounting the non-contact temperature sensor over a particular location on the electronic substrate, the actual temperature of a critical location can be measured. Furthermore, by mounting the sensor to the dispensing unit (or other mechanism, such as a vision probe in a printer) that can move in the X-axis and the Y-axis directions over the electronic substrate, the temperature of any specific spot can be measured. The sensor also may be mounted on a mechanism that moves towards and away from the target of the temperature measurement or the target can move in the X-axis, the Y-axis, and the Z-axis directions relative to the sensor. Such a configuration permits the effective spot size of the sensor to be adjusted or tailored to the needs of the application. For example, the sensor may be mounted on a vertical stage, and oriented to look down at an electronic substrate. By moving the vertical stage and sensor lower and thus closer to the electronic substrate, the temperature of a smaller localized spot may be measured. By moving the vertical stage and the sensor up and thus further from the electronic substrate, the temperature to be measured may effectively be averaged over a larger area. This can also be achieved by moving the target relative to the sensor to specific locations and to achieve specific spot sizes. Such an arrangement permits the sensing of a temperature averaged over a controllable size region in which the size of the sensing area may be optimized for the application requirements. Thus, by mounting the sensor to a Z-axis stage which is in turn mounted to an X-Y positioning system, for example from a pump mounting bracket, both the location and the size of the spot can be controlled.

By implementing the principles of the present disclosure, a deposition system can monitor the temperature of the materials to be dispensed by the piece of equipment, as well as the temperature of critical locations on the electronic substrate upon which the material is to be dispensed, ensuring that all the participants in the deposition process are at the desired temperature. Each of these measured temperatures may be utilized to confirm that process variables are within a preset range prior to proceeding with the deposition process. Additionally (or perhaps alternatively), these measurements may be shared or stored for data collection purposes, such as Statistical Process Control (SPC), wherein the quality or yield of a process may be correlated with measured variables in a process, for the purposes of process optimization.

For purposes of illustration, embodiments of the present disclosure will now be described with reference to a dispensing system, generally indicated at 10, according to one embodiment of the present disclosure. Referring to FIG. 1, the dispensing system 10 is used to dispense a viscous material (e.g., an adhesive, encapsulent, epoxy, solder paste, underfill material, etc.) or a semi-viscous material (e.g., soldering flux, etc.) onto an electronic substrate 12, such as a printed circuit board ("PCB") or semiconductor wafer. The dispensing system 10 may alternatively be used in other applications, such as for applying automotive gasketing material or in certain medical applications or for applying conductive inks. It should be understood that references to viscous or semi-viscous materials, as used herein, are exemplary and intended to be non-limiting. The dispensing system 10 includes several dispensing units, for example, first and second dispensing units, generally indicated at 14 and 16, respectively, and a controller 18 to control the operation of the dispensing system. It should be understood that dispensing units also may be referred to herein as dispensing pumps and/or dispensing heads. Although two dispensing units are shown, it should be understood that more than two dispensing units may be employed.

The dispensing system 10 may also include a frame 20 having a base or support 22 for supporting the electronic substrate 12, a dispensing unit gantry 24 movably coupled to the frame 20 for supporting and moving the dispensing units 14, 16, and a weight measurement device or weigh scale 26 for weighing dispensed quantities of the viscous material, for example, as part of a calibration procedure, and providing weight data to the controller 18. A conveyor system (not shown) or other transfer mechanism, such as a walking beam, may be used in the dispensing system 10 to control loading and unloading of electronic substrates to and from the dispensing system. The gantry 24 can be moved using motors under the control of the controller 18 to position the dispensing units 14, 16 at predetermined locations over the electronic substrate. The dispensing system 10 may include a display unit 28 connected to the controller 18 for displaying various information to an operator. There may be an optional second controller for controlling the dispensing units. Also, each dispensing unit 14, 16 can be configured with a Z axis sensor to detect a height at which the dispensing unit is disposed above the electronic substrate 12 or above a feature mounted on the electronic substrate. The Z axis sensor is coupled to the controller 18 to relay information obtained by the sensor to the controller.

Prior to performing a dispensing operation, as described above, the electronic substrate, e.g., the printed circuit board, must be aligned or otherwise in registration with a dispensing unit of the dispensing system. The dispensing system further includes a vision system 30, which, in one embodiment, is coupled to a vision system gantry 32 movably coupled to the frame 20 for supporting and moving the vision system. In another embodiment, the vision system 30 may be provided on the dispensing unit gantry 24. As described, the vision system 30 is employed to verify the location of landmarks, known as fiducials, or components on the electronic substrate. Once located, the controller can be programmed to manipulate the movement of one or more of the dispensing units 14, 16 to dispense material on the electronic substrate.

In one embodiment, the dispense operation is controlled by the controller 18, which may include a computer system configured to control material dispensing units. In another embodiment, the controller 18 may be manipulated by the operator. The controller 18 is configured to manipulate the movement of the vision system gantry 32 to move the vision system so as to obtain one or more images of the electronic substrate 12. The controller 18 further is configured to manipulate the movement of the dispensing unit gantry 24 to move the dispensing units 14, 16 to perform dispensing operations.

Figure 2:
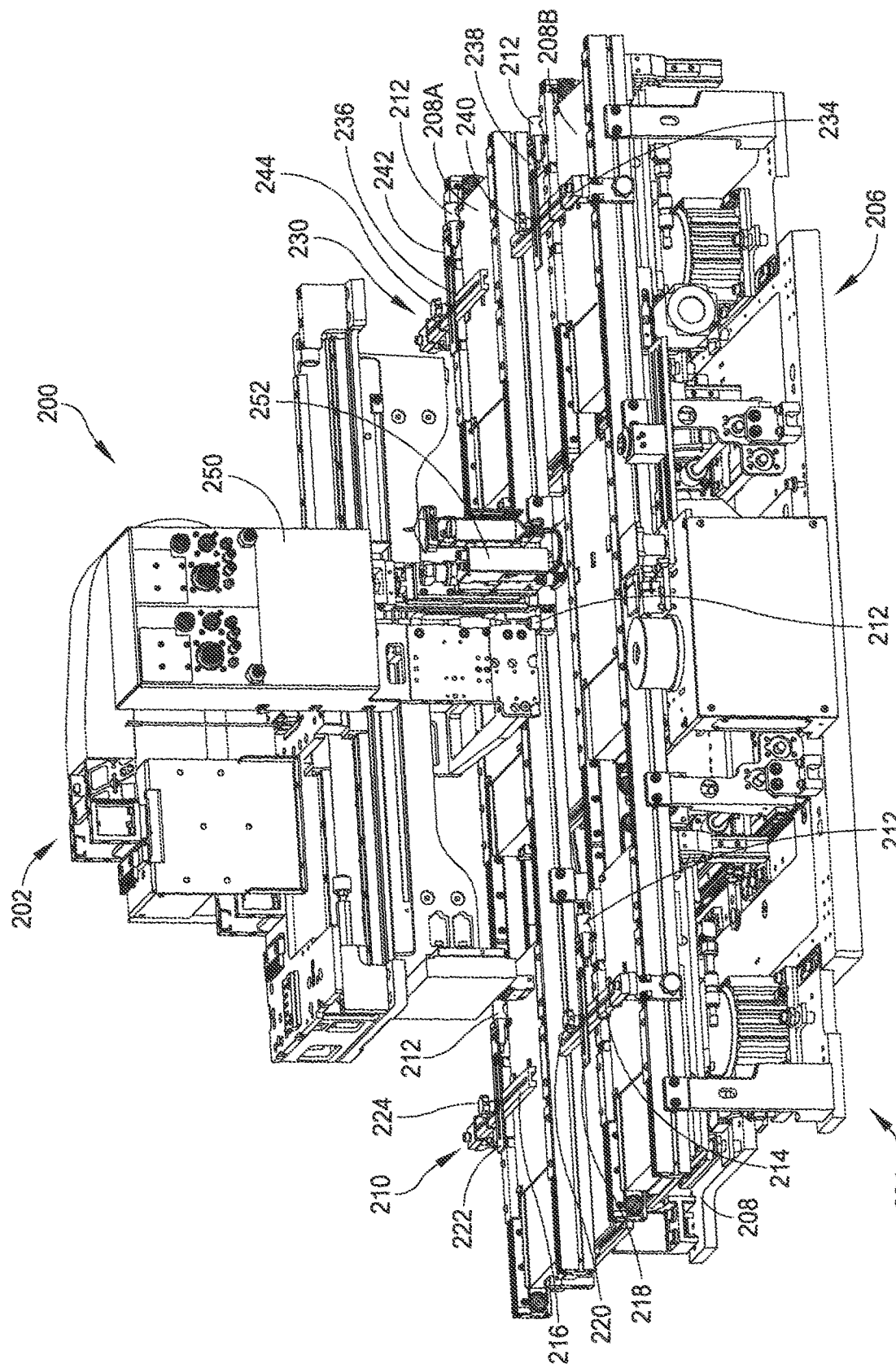
FIG. 2 is a perspective view of a dispensing system with packaging removed to disclose a pre-heat station, a dispense station and a post-heat station.

Referring to FIG. 2, a dispensing system is generally indicated at 200. As shown, the dispensing system 200 includes a dispense station, generally indicated at 202, a pre-heat station, generally indicated at 204, provided upstream before the dispense station, and a post-heat station, generally indicated at 206, provided downstream after the dispense station. The pre-heat station 204 defines a pre-heat zone, the dispense station 202 defines a dispense zone, and the post-heat station 206 defines a post-heat zone of the dispensing system 200. A conveyor 208 is provided to move an electronic substrate, such as substrate 12, from the pre-heat station 204 to the dispense station 202 and to the post-heat station 206 (left-to-right in FIG. 2). As shown, the conveyor 208 includes two lanes 208A, 208B to enable substrates to enter the dispense station more efficiently and at a greater rate. The pre-heat station 204 is configured to heat the electronic substrate to an acceptable temperature for dispensing at the dispense station. The pre-heat station 204 can be configured to increase the temperature of the electronic substrate between a range of 20° C. to 200° C. The post-heat station 206 is configured to reduce the temperature of the electronic substrate prior to being passed along to another processing station downstream from the dispensing system 200. As with the pre-heat station 204, the post-heat station can be configured to reduce the temperature of the electronic substrate between a range of 20° C. to 200° C.

In one embodiment, the pre-heat station 204 and the post-heat station 206 can be part of the dispensing system 200 that includes the dispense station 202. In another embodiment, the dispensing system 200 can be configured to include the dispense station 202 only, and the pre-heat station 204 and/or the post-heat station 206 can be separate units that are assembled with the dispensing system, with the conveyor 208 extending through all three stations.

The pre-heat station 204 includes an adjustable bracket, generally indicated at 210, that is mounted on the conveyor 208 in an elevated position over the lanes 208A, 208B of the conveyor. As shown, the adjustable bracket 210 is positioned over the electronic substrate as the electronic substrate travels along the lanes 208A, 208B of the conveyor 208 through the pre-heat station 204. For each lane 208A, 208B, an infrared sensor 212 is mounted on the adjustable bracket 210 and is positioned to be directed toward the electronic substrate as the electronic substrate travels under the adjustable bracket and the infrared sensor on the lane of the conveyor. The adjustable bracket 210 of the pre-heat station 204 can be configured to move each infrared sensor 212 in the X-axis, Y-axis and Z-axis directions.

In one embodiment, the adjustable bracket 210 includes a first rail member 214 that extends over lane 208A and a second rail member 216 that extends over lane 208B. The first rail member 214 includes a first support member 218 that is configured to ride along a track formed in the first rail member. A first thumb screw 220 is provided to secure the first support member 218 to the first rail member 214 to lock the first support member in place. The infrared sensor 212 is mounted on a free end of the first support member 218. Similarly, the second rail member 216 includes a second support member 222 that is configured to ride along a track or slot formed in the second rail member. A second thumb 224 screw is provided to secure the second support member 222 to the second rail member 216 to lock the second support member in place. The infrared sensor 212 is mounted on a free end of the second support member 222. The locations of the infrared sensors 212 can be adjusted by unlocking the thumb screws 220, 224 and moving the respective first and second support members 218, 222 to desired locations.

For each lane 208A, 208B, by mounting the infrared sensor 212 over a particular location of the electronic substrate as the electronic substrate travels along the lane, the actual temperature of a critical location of the electronic substrate can be measured. The adjustable bracket 210 is configured to move each infrared sensor 212 towards and away from the target of the temperature measurement in the Z-axis direction and to position the infrared sensor in the X-axis and the Y-axis directions. Such a configuration permits the effective spot size of the infrared sensor to be adjusted or tailored to the needs of the application. As mentioned above, the infrared sensor 212 can be oriented to look down at the electronic substrate. By manipulating the adjustable bracket 210 to lower the infrared sensor 212 closer to the electronic substrate, the temperature of a smaller localized spot may be measured. Conversely, by manipulating the adjustable bracket 210 to raise the infrared sensor 212 away from the electronic substrate, the temperature of a larger spot may be measured, thereby effectively being averaged over a larger area. Such a configuration enables the sensing of a temperature averaged over a controllable size region in which the size of the sensing area may be optimized for the application requirements.

Similarly, the post-heat station 206 includes an adjustable bracket, generally indicated at 230, which is identical to adjustable bracket 210 of the pre-heat station 204, and is mounted on the conveyor 208 in an elevated position over the electronic substrate, such as electronic substrate 212, as the electronic substrate travels along the lanes 208A, 208B of the conveyor through the post-heat station. For each lane 208A, 208B, an infrared sensor 212, which is identical to the infrared sensors used in the pre-heat station 204, is mounted on the adjustable bracket 230 and is positioned to be directed toward the electronic substrate as the electronic substrate travels under the adjustable bracket and the infrared sensor. The adjustable bracket 230 of the post-heat station 206 can be configured to move each infrared sensor 212 in the X-axis, Y-axis and Z-axis directions.

As mentioned, in one embodiment, the adjustable bracket 230 is identical to adjustable bracket 210, and includes a third rail member 234 that extends over lane 208A and a fourth rail member 236 that extends over lane 208B. The third rail member 234 includes a third support member 238 that is configured to ride along a track or slot formed in the third rail member. A third thumb screw 240 is provided to secure the third support member 238 to the third rail member 234 to lock the third support member in place. The infrared sensor 212 is mounted on a free end of the third support member 238. Similarly, the fourth rail member 236 includes a fourth support member 242 that is configured to ride along a track formed in the fourth rail member. A fourth thumb screw 244 is provided to secure the fourth support member 242 to the fourth rail member 236 to lock the fourth support member in place. The infrared sensor 212 is mounted on a free end of the fourth support member 242. The locations of the infrared sensors 212 can be adjusted by unlocking the third and fourth thumb screws 240, 244 and moving the third support member 238 and the fourth support member 242 to desired locations.

In one embodiment, the dispense station 202 further includes an infrared sensor 212 mounted on a carriage 250 that supports a dispensing unit 252 or on the dispensing unit directly. Thus, the infrared sensor 212 is moved by the gantry in the X-axis, Y-axis and Z-axis directions. The infrared sensor 212 can be operated to ensure that the electronic substrate as it is positioned within the dispense station 202 on lane 208A or 208B of the conveyor 208 is at a suitable temperature for dispensing. As described above with respect to the pre-heat station 204 and the post-heat station 206, the dispense station can be configured to increase, maintain and/or decrease the temperature of the electronic substrate between 20° C. and 200° C.

Alternatively, in another embodiment, the infrared sensor 212 can be mounted on the vision system gantry, such as the vision system gantry 32 of dispensing system 10, to move the infrared sensor in the X-axis, Y-axis and Z-axis directions. As with dispensing system 10, the dispensing system 200 can include more than one dispensing unit, with the infrared sensor 212 being mounted on one of the dispensing units.

Thus, infrared sensing is used for non-contact temperature tracking over components on the electronic substrate carried by the conveyor. Temperature sensing enables the operator to monitor and record the temperature of the substrate in each process zone (up to six) within the machine. Pre-heat and post-heat dispense zones use the infrared sensors mounted to the adjustable brackets in which the infrared sensors are positioned and locked in place. The dispense zone(s) uses the infrared sensor mounted to the carriage and/or the dispensing unit so the configuration is flexible as to the location as set in the process program.

For each process zone, the operator selects a target temperature and tolerance range that the product needs to reach in order to be considered "ready." "Ready" can mean that the product can move to the next conveyor zone or if in the dispense zone "ready" for the dispense process to begin. The other objective is to keep the substrate in the "ready" state, so when at temperature the machine automatically adjusts heat settings to keep the product within the desired tolerance range.

Referring to FIG. 3, which shows graphic user interface or GUI 300, infrared or IR sensing for electronic substrate temperature can be configured for all three zones, i.e., the pre-heat zone, the dispense zone, and the post-heat zone, through dedicated software. Within these zones, IR sensing is achieved with the non-contact heat sensors and electronic substrate clamping and can be configured for both single and dual-lane machine through execution software.

Referring to FIG. 4, which shows GUI 400, both pre-heat and post-heat sensing can be configured with non-contact heat sensing. The dispense station configuration includes an option to enable IR sensing.

The operator can program temperature settings for each program individually under a temperature tab while creating a new process program. The operator checks option "Use Temperature Settings from Process Program" to override the temperature settings from the machine configuration under the temperature tab. An alarm status changes from "Using Machine Config Parameters" to "Using Process Program Parameters." If a process required heat, then a "Heat Required" option can be checked to ensure no process program running without proper heat. The software can be configured to issue an alarm in this case.

Figure 5:
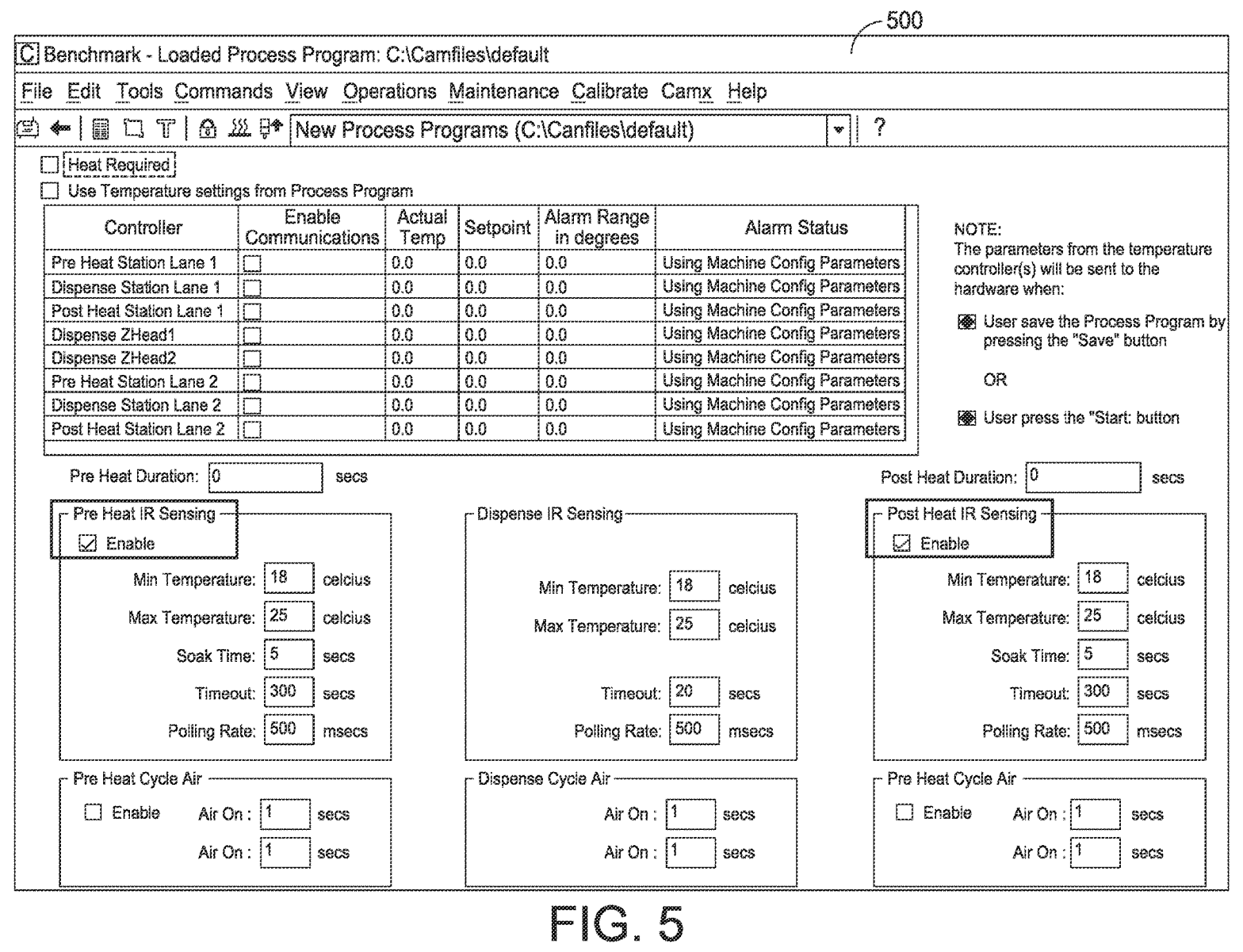

Referring to FIG. 5, which shows GUI 500, a maximum temperature limit for IR sensing is 100° C. for all three zones, i.e., the pre-heat zone, the dispense zone, and the post-heat zone. The operator has an option to enable IR sensing ON/OFF for each zone within the process program. Default values for "Min. Temperature," "Max. Temperature," "Soak Time," "Timeout" and "Polling Rate" are displayed for each zone, which are represented in Table 1.

time expires, then an alarm is triggered. For recovery, the steps are retry, abort, or release to next zone. During an error state, if the operator does not perform any error recovery, the electronic substrate may heat up and reaches the maximum temperature value. To avoid this effect, the software is configured to post an alarm, pause the machine, cycle the station air and keep measuring the electronic substrate temperature until the operator performs error recovery.

In the dispense zone, the process includes receiving the electronic substrate and measuring a temperature of the electronic substrate. If not within range, heating is started until within range before timeout expires. Measuring the temperature is continued until within range. If within range, processing is started right away. At an end of the dispense cycle, the electronic substrate is moved to a next station as soon as possible. During error state, if the operator does not perform any error recovery, the electronic substrate may heat up and reach a maximum temperature value. To avoid this effect, the software is configured to turn off station air, post an alarm, pause the machine, and keep measuring the electronic substrate temperature until the operator perform error recovery. The process program can have multiple IR sense commands, and IR sensing is batched with dispense pass. The ability to sense electronic substrate temperature multiple times within dispense pass. There will only be a minimum temperature (no maximum temperature). When an IR sense command is actuated, dispensing is suspended until

TABLE 1

| | |
|---|---|
| Min. Temp. | Minimum electronic substrate temperature required for pre heat, dispense and post heat zone |
| Max. Temp. | Maximum electronic substrate temperature required for pre heat, dispense and post heat zone |
| Soak Time | Time spent to maintain electronic substrate temperature within range before transferring to next zone. Once soak time expired and next zone free electronic substrate will be transferred to the next station (for pre heat/post heat). |
| Timeout | Timeout occurs if the electronic substrate temperature does not fall within the programmed temperature range with the programmed time limit. Benchmark will alarm if Timeout happens. |
| Polling Rate | How often the IR sensor reads the electronic substrate temperature |

Referring to FIG. 6, which shows GUI 600, if IR sensing is disabled for the pre-heat and/or post-heat zones, then the heating chucks associated with these zones should be heated up with a timer. A pre-heat and/or post-heat duration timer is initiated to heat the chucks. Once the timer expires, cycle station air should be switched back and forth ON/OFF based on values entered.

The actual readings for the IR sensors are displayed real-time on the GUI through a data display panel as well as being a traceable MES function desired behavior of electronic substrate handling in each zone as explained below.

In the pre-heat and/or post-heat zones, the process includes receiving an electronic substrate and start heating. Once at minimum temperature, a soak time is started. While soaking or waiting to move, heat is cycled ON/OFF when the temperature hits a minimum or maximum predesignated temperature. Once the soak time has expired and the next zone is free, the electronic substrate is moved, and if the electronic substrate does not get in range before timeout a minimum temperature is reached. The alarm time applies to each IR sense command as with pre-heat and post-heat sensing.

The infrared temperature sense command can be programmed at a desired electronic substrate location multiple times within the same process program on the electronic substrate. A chuck temperature, IR sensing state timer, electronic substrate temperature, IR sensing state (ramping, soaking, maintaining), station air ON/OFF are listed on a data display for easy process monitoring. Station air light on data display turns green when ON and turns red when OFF. The status is displayed only when process program is running.

Figure 7:
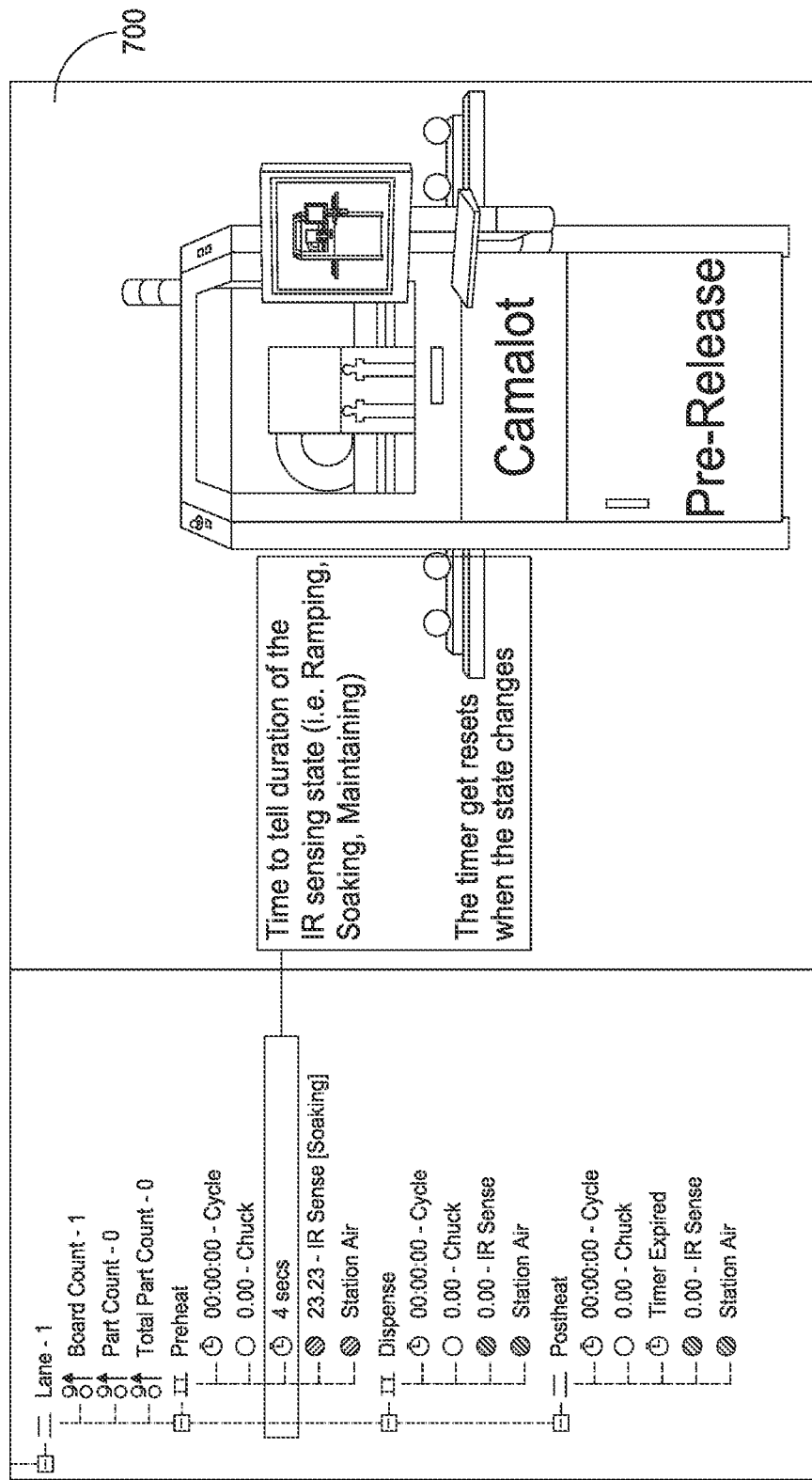
FIGS. 7 and 8 are GUIs of a process monitoring graphic.

Referring to FIG. 7, which shows GUI 700, when IR sensing is enabled, the timer tells the duration of the IR sensing state (i.e. how long the temperature ramps up, soaking or maintaining). The timer resets when the state changes.

Different states of IR sensing are shown in Table 2

TABLE 2

| | |
|---|---|
| Ramping | Electronic substrate arrived at the station and the electronic substrate temperature is ramping up/down. |

TABLE 2-continued

Soaking  Perform soaking for desired soak time.
Cycle Air  Maintaining electronic substrate temperature. Cycle the station air ON/OFF.
Completed  IR sensing operation is completed.
Electronic substrate is transferred to the next station (for preheat/
post heat)
Next command is ready to be executed (for dispense zone)
Electronic substrate is transferred to the next station (for dispense zone
with "maintain heat")

Figure 8:
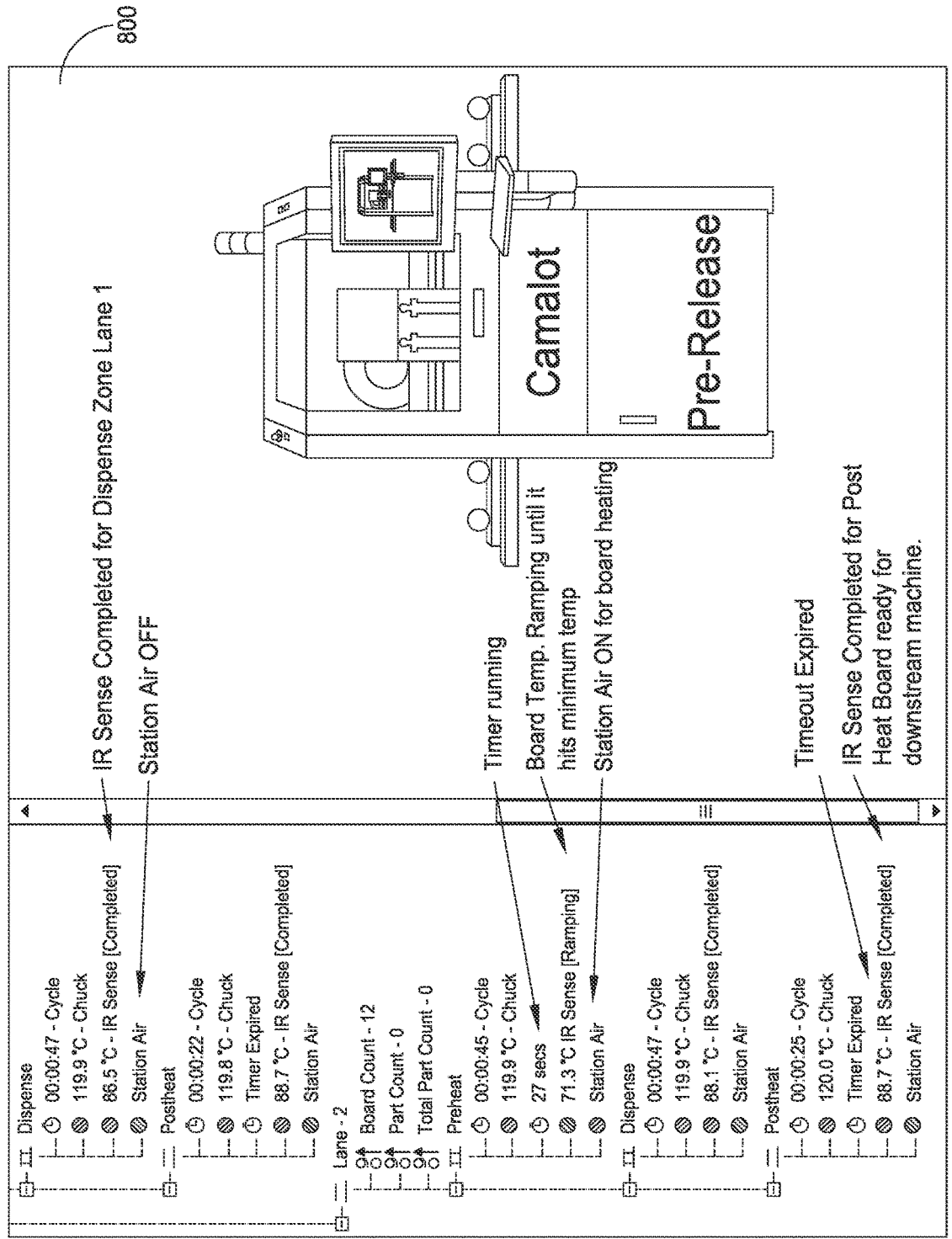

Referring to FIG. 8, which shows GUI 800, when "Maintain Temp" is selected by the operator, the IR sensor continue to read the temperature and maintain the temperature within minimum and maximum by cycling the air. It acts the same as pre/post heat stations do presently.

Generally, when the electronic substrate comes into the pre heat zone, IR sensing state changes as follows: Ramping→Soaking→Completed→Maintaining.

Figure 9:
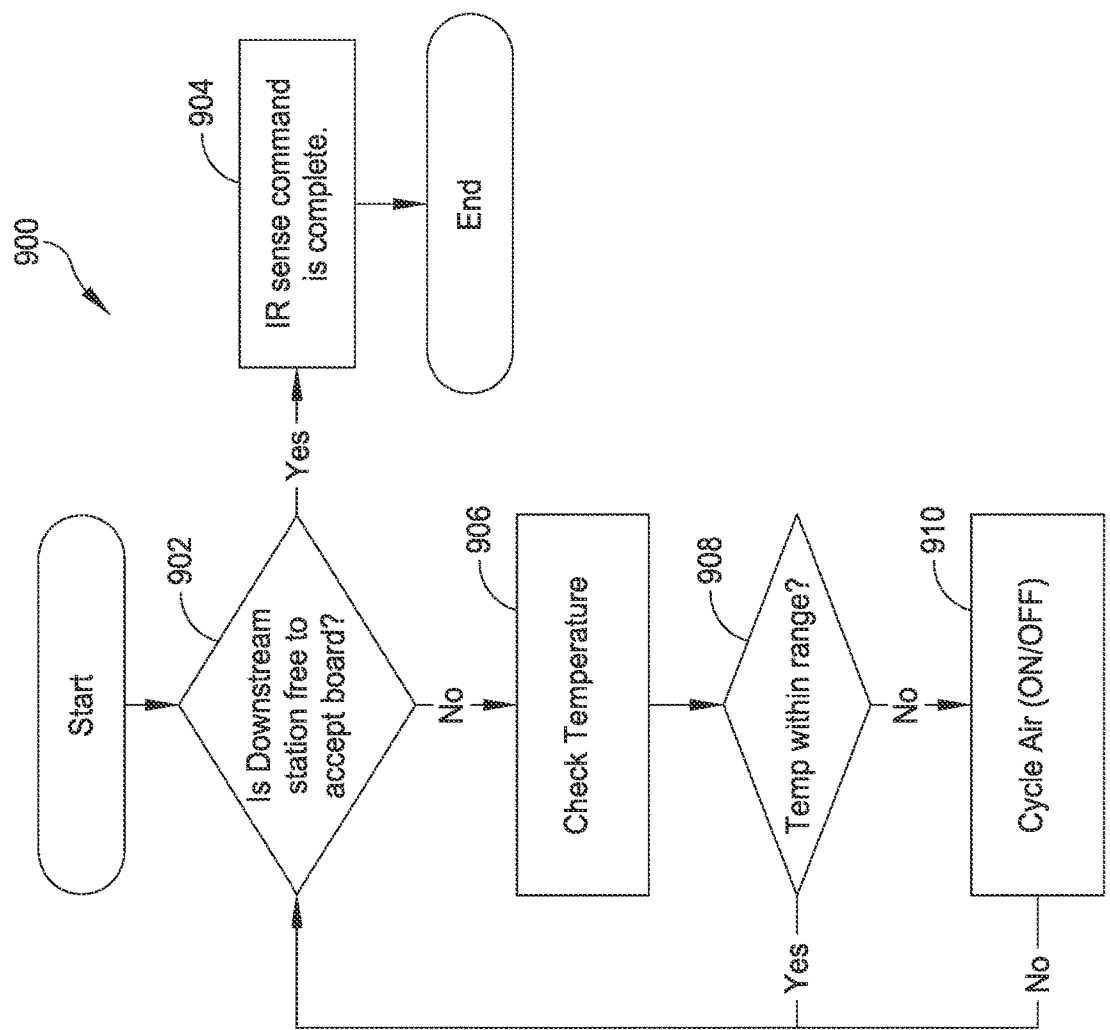
FIG. 9 is a flow chart of an operation of an IR sense command.

Referring to FIG. 9, process 900 includes ensuring that the temperature is maintained until the next station is free to accept electronic substrate. As shown, a determination is made at 902 as to whether a downstream station is free to accept an electronic substrate. If yes, then the IR sense command is complete at 904 and the operation ends. If no, then the temperature is detected at 906 by a non-contact sensor, and a determination is made at 906 as to whether the temperature is within a predetermined range. If yes, the process goes back to whether a downstream station is free to accept an electronic substrate. If no, air is cycled ON/OFF at 910 until the process goes back to whether a downstream station is free to accept an electronic substrate.

Figure 10:
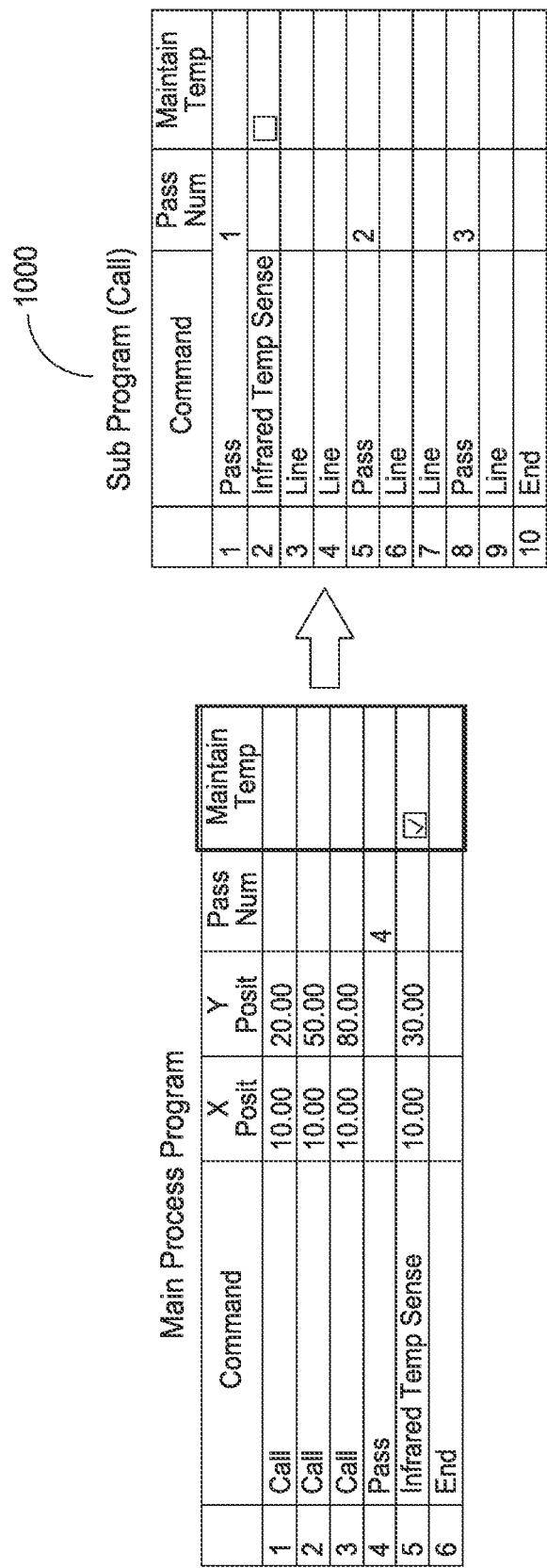
FIG. 10 is a GUI of an IR sense command graphic.

Referring to FIG. 10, which shows GUI 1000, the operator should place the IR sense command in the main process program if "maintain temperature" is required. If the IR sense command is located inside a call, this feature can be ignored. When using "pass," the operator should assign the last pass to the IR sense command.

Referring to FIG. 11, which shows GUI 1100, when idle, all heat is powered off. The operator can choose to power off all heat which includes chucks and needle heating based on programmed time in minutes. This functionality lies under a temperature tab in a machine configuration and works only in a dispense AUTOMATIC MODE. The operator can also check option to disable the power off heat function during production run.

Referring to FIG. 12, which shows GUI 1200, at start-up, heat controllers are powered on. If the operator checks this option, then heat controllers which includes up to six chucks and two needle heaters will be powered on after startup. All heaters will start ramping up as left enabled by the operator during last machine shut down only after server startup. If somehow the server startup is not automatic, then heat controllers will not power on. In that case an operator must manually start the server to power on the heat controllers. This functionality lies under the temperature tab in the machine configuration and works in all dispense modes.

In one embodiment, a distance that the non-contact sensor is spaced from the electronic substrate depends on the type of non-contact sensor selected. For example, for one type of sensor, the sensor can be spaced from the electronic substrate a distance of 1 millimeters (mm) to 100 mm. In one embodiment, a sensing spot size generated by the non-contact sensor corresponds to a spacing of the non-contact sensor from the electronic substrate. Thus, by increasing a distance of the spacing of the non-contact sensor from the electronic substrate, the sensing spot size is increased. Accordingly, a range for use within the print head assembly of embodiments of the present disclosure is a distance of 1 mm to 100 mm. In one embodiment, a distance of 25 mm is selected.

The non-contact sensor is configured to detect a temperature of the electronic substrate to confirm whether the temperature is correct for the particular application, using criteria pre-determined by a user setup process in which the operator of the dispensing system inputs settings for the dispensing system before a dispense operation. The non-contact sensor is connected to the controller, and is configured to immediately notify the operator if the electronic substrate is not ready for deposition. Additionally, temperature data of the electronic substrate or multiple electronic substrates can be collected by the controller. The data collected can be fed back to the dispensing system for additional actions, or it can be sent to a data collection system, such as downstream machines or either internal or remote statistical processing.

In certain embodiments, the non-contact sensor is an infrared sensor to detect the temperature of the electronic substrate. The infrared sensor is an electronic sensor that is configured to measure infrared light that radiates from an object positioned in a field of view of the sensor. Objects having a temperature above absolute zero emit heat in the form of radiation. In a certain embodiment, the infrared sensor is a T-GAGE™ M18T Series Infrared Temperature Sensor offered by Banner Engineering Corporation of Minneapolis, Minn. The T-GAGE™ sensor is a passive, non-contact, temperature-based, sensor that is used to detect an object's temperature within a sensing window and output a proportional voltage or current, depending on the configuration of the sensor.

A non-contact sensor, such as non-contact sensor, positioned above the electronic substrate on the pre-heat chuck can be utilized to confirm that the electronic substrate is indeed at the proper temperature before proceeding with the dispensing operation, without the need to wait longer than necessary to ensure that components of the system are at an adequate temperature. By mounting the non-contact sensor over a particular location on the electronic substrate, the actual temperature of a critical location can be measured. Furthermore, by mounting the sensor to the dispensing unit (or other mechanism, such as a vision probe in a printer) that can move in the x-axis and y-axis directions over the electronic substrate, the temperature of any specific spot can be measure within the dispense station. The non-contact sensor also may be mounted on a mechanism that moves towards and away from the target of the temperature measurement or the target can move in the x-axis, y-axis and z-axis directions relative to the sensor. Such a configuration permits the effective spot size of the sensor to be adjusted or tailored to the needs of the application. For example, the non-contact sensor may be mounted on a vertical stage, and oriented to look down at an electronic substrate. By moving the vertical stage and sensor lower and thus closer to the electronic substrate, the temperature of a smaller localized spot may be measured. By moving the vertical stage and sensor up and thus further from the electronic substrate, the temperature to be measured may effectively be averaged over a larger area. This can also be achieved by moving the target relative to the sensor to specific locations and to achieve specific spot sizes. Such arrangements permit the sensing of a temperature averaged over a controllable size region, wherein the size of the sensing area may be optimized for the application requirements. Thus, by mounting the sensor to a Z stage, which is in turn mounted to an X-Y positioning system, both the location and the size of the spot can be controlled.

Additionally (or perhaps alternatively), measurements may be shared or stored for data collection purposes, such as statistical process control (SPC), wherein the quality or yield of a process may be correlated with measured variables in a process, for the purposes of process optimization.

In another embodiment of the present disclosure, an infrared non-contact temperature sensor is used to provide temperature feedback of the electronic substrate temperature as part of a temperature regulation system. In particular, when an electronic substrate has reached a desired target temperature, commonly referred to as a set-point temperature, the temperature control system turns off the heat to the electronic substrate. Subsequently, when the temperature drops below a low temperature limit, the temperature control system turns the heat on. In some embodiments, the operation of turning the heat on or off may entail enabling or disabling power to the heaters. In other embodiments, this operation may entail enabling or disabling a heat transfer mechanism. For example, in one embodiment of the present invention, air is circulated past a heated surface and then to the substrate. When the airflow is enabled, the transfer of heat from the heater to the substrate is enhanced. When the airflow is disabled, the transfer of heat from the heater to the substrate is inhibited. This simple limit-cycle approach may provide sufficient temperature control accuracy for many applications.

In other embodiments of the present disclosure, an infrared non-contact temperature sensor is used to provide temperature feedback of the electronic substrate temperature as part of a closed-loop temperature control system. In such a system, the controller uses the measured temperature and the desired set-point temperature as inputs to a control algorithm. The algorithm may also have proportional control of the heater, which provides the ability to not just enable or disable heat, but rather to enable the heater at a number of smaller steps between full on or full off. In one embodiment of the present disclosure, a digital proportional/integral/derivative controller, commonly referred to as a PID controller, uses the output of a PID algorithm, through Pulse-Width Modulation (PWM) means to vary the on/off duty cycle of a heater. This combination of a PID controller and digital proportional control of the heater can achieve temperature regulation that may be more precise and more closely regulated that that achieved with a limit cycle regulator.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A method of dispensing an assembly material on an electronic substrate, the method comprising:
    delivering an electronic substrate to a dispensing system including
        a frame,
        a pre-heat station coupled to the frame and configured to receive and heat the electronic substrate, the pre-heat station including a first non-contact sensor positioned to measure a temperature of the electronic substrate,
        a dispense station coupled to the frame, the dispense station including a dispensing unit gantry configured to move in x-axis and y-axis directions and at least one dispensing unit coupled to the dispensing unit gantry by a carriage configured to move the at least one dispensing unit in a z-axis direction, the at least one dispensing unit being configured to dispense material on the electronic substrate positioned on a substrate support, the dispense station further including a second non-contact sensor positioned above the electronic substrate on the dispense station, the second non-contact sensor being mounted on the carriage and directed toward the substrate to measure a temperature of the electronic substrate;
    moving the electronic substrate in a pre-dispense position within the pre-heat station;
    measuring a temperature of the electronic substrate in the pre-dispense position with the first non-contact sensor positioned above the electronic substrate;
    if the electronic substrate is at a proper temperature, moving the electronic substrate to a dispense position within the dispense station;
    dispensing viscous assembly material on the electronic substrate; and
    measuring a temperature of the electronic substrate in the dispense position with the second non-contact sensor positioned above the electronic substrate to ensure the electronic substrate is at a proper temperature.

2. The method of claim 1, wherein each of the first non-contact sensor and the second non-contact sensor is an infrared sensor.

3. The method of claim 1, further comprising positioning the first non-contact sensor with respect to the electronic substrate by a first adjustable bracket.

4. The method of claim 3, further comprising positioning the second non-contact sensor with respect to the electronic substrate by the carriage.

5. The method of claim 1, further comprising:
    if the electronic substrate is at a proper temperature, moving the electronic substrate to a post-dispense position within a post-heat station; and
    measuring a temperature of the electronic substrate in the post-dispense position with a third non-contact sensor positioned above the electronic substrate to ensure that the electronic substrate is at a proper temperature.

6. The method of claim 5, further comprising positioning the first non-contact sensor with respect to the electronic substrate by a first adjustable bracket.

7. The method of claim 6, further comprising positioning the second non-contact sensor with respect to the electronic substrate by the carriage.

8. The method of claim 7, further comprising positioning the third non-contact sensor with respect to the electronic substrate by a second adjustable bracket.

9. The method of claim 1, further comprising providing temperature feedback of the electronic substrate as part of a temperature control system.

10. The method of claim 9, wherein providing temperature feedback includes, when an electronic substrate has reached a desired target temperature, the temperature control system turns off the heat to the electronic substrate, and when the temperature drops below a low temperature limit, the temperature control system turns the heat on.

* * * * *